United States Patent [19]

Sequin et al.

[11] 4,197,511
[45] Apr. 8, 1980

[54] LINEAR LOAD MOS TRANSISTOR CIRCUIT

[75] Inventors: Carlo H. Sequin, Berkeley, Calif.;
Edward J. Zimany, Jr., Morristown, N.J.

[73] Assignee: Bell Telephone Laboratories, Incorporated, Murray Hill, N.J.

[21] Appl. No.: 970,231

[22] Filed: Dec. 18, 1978

[51] Int. Cl.² .......................... H03F 3/16; H03F 1/34
[52] U.S. Cl. .................................... 330/293; 330/277
[58] Field of Search ............... 330/277, 282, 284, 293; 307/304

[56] References Cited
U.S. PATENT DOCUMENTS 3,806,742  4/1974  Powell .................................. 307/304

Primary Examiner—James B. Mullins
Attorney, Agent, or Firm—David I. Caplan

[57] ABSTRACT

The source-drain resistance of an MOS load transistor ($M_2$) is linearized by means of a pair of properly designed auxiliary MOS transistors ($M_3$ and $M_4$) whose source-drain paths are electrically coupled (conductively or through an amplifier) with the load transistor ($M_2$). The gate electrode of the load transistor ($M_2$) is connected to the common node point ($N_{34}$) between the auxiliary transistors ($M_3$ and $M_4$); whereas the transconductances ($\beta_3$ and $\beta_4$) of the auxiliary transistors ($M_3$ and $M_4$) are designed such that during operation the resulting feedback signal from the common node point ($N_{34}$) to the gate electrode of the load transistor ($M_2$) reduces its nonlinearity.

9 Claims, 11 Drawing Figures

LINEAR LOAD MOS TRANSISTOR CIRCUIT

FIELD OF THE INVENTION

This invention relates to the field of semiconductor apparatus, and more particularly to semiconductor integrated circuits to MOS technology.

BACKGROUND OF THE INVENTION

In the design of linear integrated MOS (Metal-Oxide-Semiconductor) circuits, it is often desirable to have an electrical resistance load ("attenuator") element which is linear, that is, where the current through the load is linearly proportional to the voltage across the load over a reasonably wide operating range of voltage. Such a load is particularly useful in connection with such circuits as operational amplifiers and signal filters. However, a straightforward implementation of such a load in the form of a long, resistive path of polycrystalline silicon consumes an inordinately large amount of semiconductor silicon wafer area, typically of the order of several thousand squares of the minimum feature size of the integrated circuit fabrication technique being used; or else such an implementation consumes an unreasonably large amount of power for reasonable voltage drops across such a load. On the other hand, the use of the source to drain resistance of an insulated gate metal-oxide-semiconductor field effect transistor (IGFET or MOSFET) as a load enables more compact implementation of such a load but only at the expense of nonlinearity over desired operating parameters.

It is a known characteristic of a MOSFET that, for somewhat smaller operating signal ranges than desired in linear integrated circuits, this type of transistor can serve as a linear load when operated in the linear region of the "triode region," that is, when the drain to source voltage $V_D$ is well below the "effective gate voltage" $V_{GE}$, specifically $$V_D << V_{GE} = V_G - V_{TO} \quad (1)$$

that is, the drain to source voltage should be kept well below the applied gate to source voltage $V_G$ less the threshold voltage $V_{TO}$.

An ideal (perfectly linear) resistor attenuator in a voltage divider configuration (FIG. 1) includes a pair of ideal resistors $R_1$ and $R_2$ whose ratio $(R_1/R_2)$ is selected in accordance with the desired output voltage $$V_{OUT} = V_{REF} + (V_{IN} - V_{REF})(R_1)/(R_1 + R_2) \\ = (V_{IN} R_1 + V_{REF} R_2)/(R_1 + R_2) \quad (2)$$

where $V_{IN}$ is the input signal voltage and $V_{REF}$ is a reference voltage, typically a steady DC voltage. A simple and direct implementation of this ideal resistor attenuator configuration with MOS transistors is illustrated in FIG. 2, using a pair of MOSFETs $M_1$ and $M_2$ having transconductances $\beta_1$ and $\beta_2$, respectively, where $\beta$ is proportional to the ratio of the width W to the length L of the transistor channel, as known in the art. The gate electrodes of $M_1$ and $M_2$ are connected to a high enough (for N-channel devices) supply voltage $V_{DD}$ so that operation takes place in both the transistors $M_1$ and $M_2$ in the linear portions of their triode regions. However, such an implementation as shown in FIG. 2 suffers from the disadvantage that the input signals must be restricted to an undesirably small range (typically ±2 volts for $V_{DD}$=20 volts) in order to maintain linearity during operation. This problem of large signal nonlinearity arises from the quadratic term in $V_D$ in the MOSFET drain current relationship in the triode region:

$$I_A = -\beta[(V_G - V_{TO} - V_S)(V_D - V_S) - \tfrac{1}{2}(V_D - V_S)^2] \quad (3)$$

This quadratic term $(\beta V_D^2/2)$ becomes appreciable when $V_D$ is not kept well below $(V_G - V_{TO})$, that is, when the input signals are large enough to take the operation of the MOSFET out of the linear portion of the triode region. Hence, $V_{OUT}$ will not be linear in the input signal voltage $V_{IN}$ for such large signals.

For larger signals, which take the operation out of the linear portion of the triode region, a different approach must thus be taken in order to preserve linearity. One such approach (FIG. 3) uses operation in the saturation regions of the enhancement mode MOS transistors, $M_1$ and $M_2$, in which the gate electrode of each such transistor is shorted to its drain by direct ohmic connection. Although the source-drain current now follows a square-law, the attenuator operation is still basically linear, since both transistors have the same type of functional dependence of current on voltage:

$$I_D = -\beta_1(V_{G1} - V_{S1} - V_{TO})2/2 = -\beta_2(V_{G2} - V_{S2} - V_{TO})2/2 \quad (4)$$

Accordingly, defining each $\beta = 2\alpha^2$, it follows that:

$$\alpha_1(V_{G1} - V_{S1}) = \alpha_2(V_{G2} - V_{S1}) + (\alpha_1 - \alpha_2)V_{TO} \quad (5)$$

Since, in the circuit of FIG. 3, $V_{G1}$ is the same as $V_{OUT}$ and $V_{G2}$ is the same as $V_{IN}$, it is seen that the circuit in FIG. 3 provides a linear attenuator in the voltage divider configuration. However, this circuit becomes highly nonlinear if and when the input signal $V_{IN}$ swings below the (DC) reference voltage $V_{REF}$ or even as low as to within two thresholds of $V_{REF}$, because then both transistors $M_1$ and $M_2$ are turned "off," the functions of drains and sources being reversed. Therefore, the circuit of FIG. 3 undesirably limits the input signal range for linear operation to values of $V_{IN}$ greater than at least $V_{REF} + 2 V_{TO}$.

It would therefore be desirable to have an MOS circuit which provides linear attenuation over a wider range than those of the prior art. By "linear" is meant that the total harmonic distortion for sinusoidal signals of a few volts RMS should be more than about 30 dB below the fundamental.

SUMMARY OF THE INVENTION

In order to linearize the electrical resistance of the high current (source-drain) path of an MOS field-effect transistor (MOSFET) load device, its gate electrode is connected to a node in a voltage divider chain of MOS transistor resistive loads controlled by the input signal voltage. The parameters of the transistors in this divider chain are selected to yield an attenuation in the chain such that the relationship between output voltage $V_{OUT}$ of the overall circuit and input voltage $V_{IN}$ is linear.

In a specific embodiment of the invention (FIG. 4), the voltage division furnished by a pair of series connected MOS load transistors ($M_1$ and $M_2$) is linearized by means of feedback to their gate electrodes from a pair of auxiliary nodes ($N_{45}$ and $N_{34}$) located between the high current (source-drain) paths of three auxiliary MOS transistors ($M_5$, $M_4$, and $M_3$) mutually connected in series to a constant voltage source ($V_{DD}$). By suitable selection of the transconductances of both the load and the auxiliary transistors, the voltage division operation furnished by the load transistors can be made almost linear in current, that is, the nonlinearity (or total harmonic distortion) in source-drain current vs. voltage can be made to be about 50 dB below the fundamental of a sinusoidal input signal, by reason of this feedback to the gate electrodes of the load transistors from the nodes ($N_{34}$ and $N_{45}$) during operation.

In another specific embodiment (FIG. 5), a single MOS transistor load ($M_2$) is linearized by the feedback to its gate electrode from the node ($N_{34}$) located between the high current paths of a pair of auxiliary MOS transistors ($M_4$ and $M_3$). By suitable selection of the respective transconductances, the current to voltage drop relationship of the load is linearized.

In yet another specific embodiment (FIG. 6), the MOS load transistor ($M_2$) in a voltage division circuit is linearized by feedback to its gate electrode from the node ($N_{34}$) located between a pair of auxiliary MOS transistors ($M_3$ and $M_4$). This specific embodiment (FIG. 6) for a voltage divider has advantages over the embodiment of FIG. 4 in that it can be operated with an input signal which carries $V_{IN}$ to within one threshold drop of $V_{DD}$, and in that metallization in an integrated circuit can be made simpler and at little cost in nonlinearity.

In the above described embodiments of the invention, harmonic distortion is less than −30 dB while the input signal can vary from a lower limit as little as the semiconductor substrate bias voltage (typically 0 volt for $V_{REF}=3$ to 6 volt) to an upper limit as high as $V_{DD}$ (typically 10 to 20 volt) less three thresholds (FIG. 4) or two thresholds (FIG. 5), or one threshold (FIG. 6). In still another embodiment, an MOS operational amplifier circuit of the prior art (FIG. 7) with input resistor $R_{IN}$ and feedback resistor $R_{FB}$ is realized in accordance with the invention with MOS field effect transistors (FIG. 8) replacing the resistors, such that both input resistance and feedback resistance are linearized.

In still other embodiments (FIGS. 10 and 11), MOS amplifiers are employed for coupling the high current (source-drain) path of the linearized transistor attenuator chain ($M_1$ and $M_2$) with the auxiliary transistors ($M_3$, $M_4$, and $M_5$). The use of such amplifier coupling thereby provides electrical isolation of the auxiliary transistors from the linearized transistor attenuator. Specifically, the circuit shown in FIG. 10 is particularly useful in conjunction with weak input signals, that is, input signals not strong enough to drive the transistor attenuator chain directly.

BRIEF DESCRIPTION OF THE DRAWING

This invention, together with its features, advantages, and objects may be better understood from the following detailed description when read in conjunction with the drawing in which.

DETAILED DESCRIPTION

Figure 1:
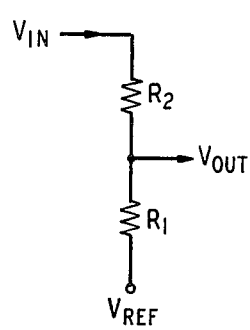
FIGS. 1–3 are circuit diagrams of prior art attenuators, useful in understanding the objects of this invention.
Figure 2:
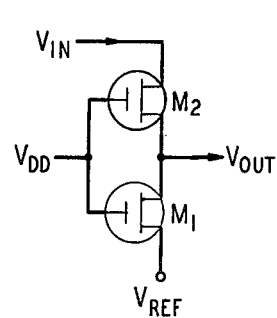
Figure 3:
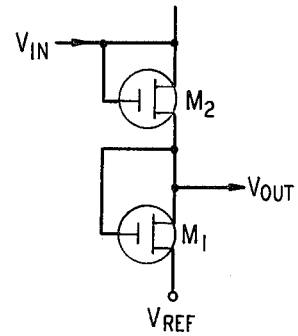
Figure 4:
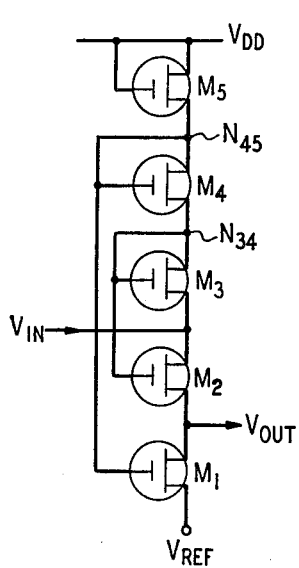
FIG. 4 is a circuit diagram of a linearized voltage divider MOS attenuator circuit in accordance with a specific embodiment of this invention.

As shown in FIG. 4, MOSFET loads $M_1$ and $M_2$ are connected with their source-drain (high current) paths in series, so as to provide a voltage divider output $V_{OUT}$ for the input signal $V_{IN}$ with respect to $V_{REF}$ (which may be ground). These load transistors are coupled with three auxiliary MOSFETs, $M_3$, $M_4$, and $M_5$ to a voltage source $V_{DD}$. The gate electrode of each such load transistor is conductively coupled (ohmically connected) directly to a different one of the two auxiliary nodes, $N_{34}$ and $N_{45}$, located between the source-drain paths of the three auxiliary MOSFETs. The transconductances of $M_3$, $M_4$, and $M_5$ are selected not only such that the transistors $M_1$ and $M_2$ operate in their triode regions but also such that the resulting feedback signals to the gate electrodes of $M_1$ and $M_2$ linearize the characteristics of operation, that is, such that the ratio of current to voltage drop is constant over the operating range. These selection criteria can be seen from the Appendix below in which quadratic (or "square law") terms in Equation (3) cancel out. In this way the current flowing through each of the load transistors $M_1$ and $M_2$ ("attenuator current") is a linear function of their respective source to drain voltage. Specific examples are also set forth below.

Figure 5:
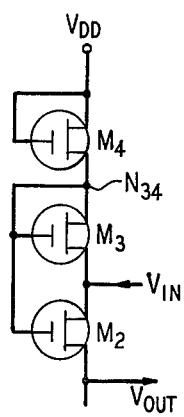
FIG. 5 is a circuit diagram of a linearized MOS transistor load attenuator in accordance with another specific embodiment of the invention.
Figure 6:
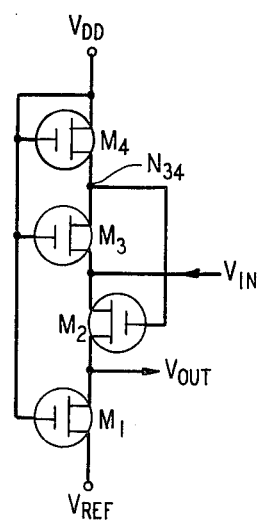
FIG. 6 is another circuit diagram of a linearized voltage divider MOS attenuator circuit in accordance with yet another specific embodiment of the invention.

The circuit shown in FIG. 5 is but a part of the circuit shown in FIG. 4 and is useful for providing but a single linearized transistor $M_2$. By suitable selection of transistor parameters, the relationship of current to voltage drop across the load transistor $M_2$ can be linearized by virtue of feedback from the node $N_{34}$ to the gate electrode of this load transistor. Accordingly, the parameters for the circuit of FIG. 5 can be readily derived in the same manner as those of FIG. 4. On the other hand, the voltage divider circuit shown in FIG. 6 is a modification of that shown in FIG. 4 in that $M_5$ is omitted and in that the gate electrodes of $M_1$ and $M_3$ are connected directly to $V_{DD}$; thereby simplifying the metallization, at some small sacrifice of linearity.

Figure 7:
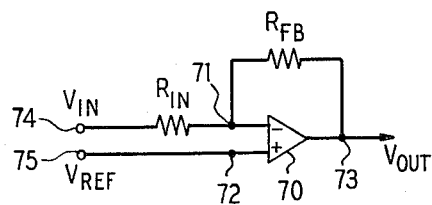
FIG. 7 is a circuit diagram of an operational amplifier with linear input and feedback resistors, in accordance with prior art.
Figure 8:
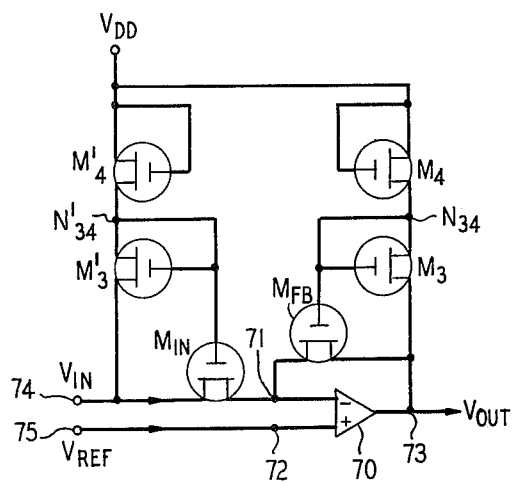
FIG. 8 is a circuit diagram of an operational amplifier with linearized MOS transistors as input and feedback resistors, in accordance with still another specific embodiment of the invention.

FIG. 7 shows a conventional operational amplifier 70 with negative feedback by virtue of a (linear) resistor $R_{FB}$ connected between the amplifier's output terminal 73 and the amplifier's negative summing input terminal 71. The conventional linear resistors $R_{IN}$ and $R_{FB}$ for the operational amplifier 70 in FIG. 7 are replaced in FIG. 8 by linearized MOS transistor $M_{IN}$ and $M_{FB}$, respectively, in accordance with the invention. Linearization of the transistor $M_{IN}$ is achieved by means of the auxiliary transistors $M'_3$ and $M'_4$ whereas linearization of the transistor $M_{FB}$ is achieved by means of the auxiliary transistor $M_3$ and $M_4$. It should be noted that transistors M'₃ and M'₄, in FIG. 8 are connected with respect to the transistor M$_{IN}$ and to V$_{DD}$ in the same manner as in FIG. 5 with M$_{IN}$ taking the place of M₂, and also that the transistors M₃ and M₄ are similarly connected with respect to M$_{FB}$ and to V$_{DD}$. The parameters for M₃, M₄, and M'₃ and M'₄ are found in the same way as for the circuit in FIG. 5. In this way, input node 71 of the operational amplifier 70 in FIG. 8 is supplied with input voltage V$_{IN}$ through the impedance offered by source-drain path of M$_{IN}$, and is supplied with feedback voltage from the output node 73 of the amplifier through the source-drain path of M$_{FB}$. Advantageously, the MOS field effect transistors M$_{IN}$, M$_{FB}$, M₃, M'₃, M₄, and M'₄ are all integrated in the same single crystal semiconductor body as are the MOS field effect transistors (not shown) of the operational amplifier 70, for ease and convenience of manufacture in accordance with well-known integrated MOS circuit techniques.

APPENDIX

Figure 9:
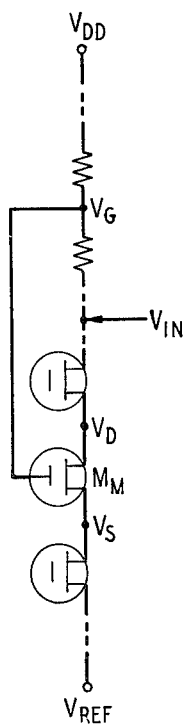
FIG. 9 is a circuit diagram illustrating the linearizing of a MOS transistor load in accordance with the invention.
Figure 10:
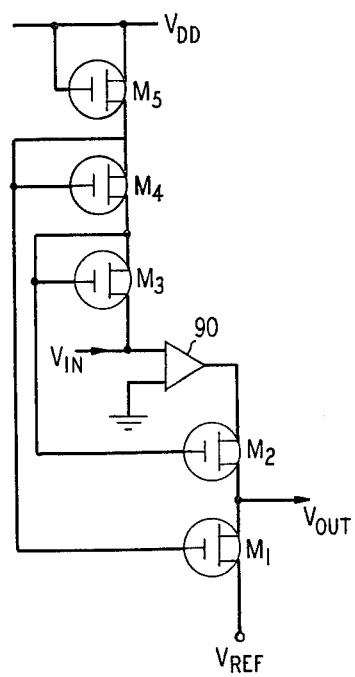
FIGS. 10 and 11 are circuit diagrams illustrating amplifier coupling in a linearized voltage divider MOS circuit in accordance with the invention.
Figure 11:
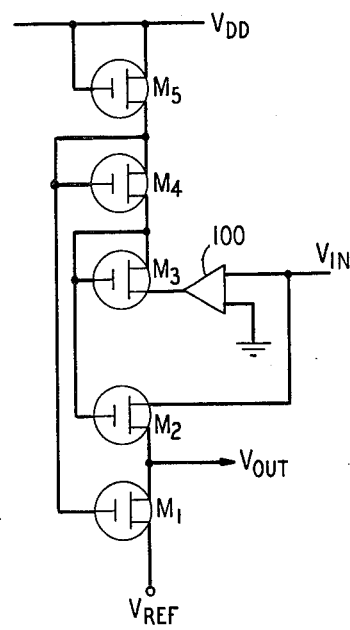

FIG. 9 shows a MOSFET M$_M$ acting as an attenuator in a series chain of load transistors, with linearizing feedback means. In accordance with the invention, the source and drain potentials (relative to semiconductor substrate) of this transistor M$_M$ should be linear functions of V$_{IN}$ and V$_{REF}$:

$$V_D = V_{IN} - e(V_{IN} - V_{REF}) \quad (6)$$

$$V_S = V_{IN} - f(V_{IN} - V_{REF}) \quad (7)$$

Likewise, the gate voltage V$_G$ of the gate electrode of the transistor M$_M$ should be linear in terms of V$_{IN}$ and V$_{DD}$:

$$V_G = V_{In} - g(V_{IN} - V_{DD}) \quad (8)$$

The parameters, e, f, and g depend upon the position of the transistor M$_M$ in the chain and upon the desired resistance of M$_M$. In accordance with Equation (3) above, since the transistor M$_M$ operates in the triode region, the source-drain current I$_A$ of the transistor M$_M$ operating as an attenuator will be given by:

$$I_A = -\beta[(V_G - V_{TO} - V_S) - \tfrac{1}{2}(V_D - V_S)](V_D - V_S) \quad (9)$$

Replacement of the voltages by their respective values given in Equations (6)-(8):

$$I_A = -\beta[gV_{DD} - V_{TO} - \frac{e+f}{2} V_{REF} - (\frac{e+f}{2} - g)V_{IN}](f - e)(V_{IN} - V_{REF}) \quad (10)$$

In order to achieve linearity in terms of V$_{IN}$, the coefficient of V$_{IN}$ within the square bracket must vanish:

$$\frac{e+f}{2} - g = 0; \quad (11)$$

or $$g = (e + f)/2.$$

Using this expression for g in Equations (8) and (10), the conditions for linearity become:

$$V_G = \frac{2 - e - f}{2} V_{IN} + \frac{e+f}{2} V_{DD} \quad (12)$$

and $$I_A = -\beta[g(V_{DD} - V_{REF}) - V_{TO}](f-e)(V_{IN} - V_{REF}) \quad (13)$$

If the input voltage V$_{IN}$ falls below the reference voltage V$_{REF}$, i.e., V$_{IN}$ < V$_{REF}$, the roles of source and drain are reversed; however, the current is still given by Equation (9) but with the parameters e and f reversed in both Equations (6) and (7), and therefore also in Equation (10). Moreover, since these parameters e and f appear symmetrically in Equation (10), the conditions for linearity given by Equations (12) and (13) remain the same for this case of V$_{IN}$ < V$_{REF}$.

For the case of a two-transistor voltage divider attenuator configuration (FIG. 4) such that the input signal V$_{IN}$ is attenuated to a fraction h thereof:

$$V_{OUT} - V_{REF} = h(V_{IN} - V_{REF}) \quad (14)$$

Since, for this case (FIG. 4), the output voltage V$_{OUT}$ is equal to the V$_D$ of M₁ and the V$_S$ of M₂, while V$_{IN}$ is the V$_D$ of M₂, and V$_{REF}$ is the V$_S$ of M₁, it follows from Equations (6), (7), and (13) that in this case (FIG. 4):

$$e_1 = 1 - h; f_1 = 1; g_1 = 1 - (h/2) \quad (15)$$

$$e_2 = 0; f_2 = 1 - h; g_2 = (1-h)/2 \quad (16)$$

With this knowledge of g₁ and g₂, the auxiliary transistors for such feedback can be readily designed. If V$_{DD}$ is high enough, the three transistors M₃, M₄, and M₅ (FIG. 4) will always operate in their saturation regions, so that even for maximum signal there are still at least three threshold voltage drops across these three transistors. Moreover, by use of Equation (10), in conjunction with an operating attenuator current I$_A$ and given operating voltages (V$_{DD}$, V$_{IN}$, V$_{REF}$), the transconductances β₁ and β₂ of M₁ and M₂ can readily be calculated. Furthermore, from Equation (4), the three transconductances (β₃, β₄, β₅) of the three auxiliary transistors (M₃, M₄, M₅) are in the ratio of approximately (neglecting V$_{TO}$):

$$(1/\beta_3):(1/\beta_4):(1/\beta_5) = g_2^2 : (g_1 - g_2)^2 : (1 - g_1)^2 \quad (17)$$

EXAMPLES

As an example, for purposes of illustration only, the voltage divider configuration of FIG. 4 is designed to provide an attenuation factor h = 0.2, it follows from Equations (15) and (16) that:

$$e_1 = 0.8; f_1 = 1; g_1 = 0.9 \quad (18)$$

$$e_2 = 0; f_2 = 0.8; g_2 = 0.4 \quad (19)$$

In this example, the following operating parameters are used in N-MOS technology:
V$_{DD}$ = 20 volt;
V$_{REF}$ = 6 volt;
V$_{IN}$ = 12 volt ± signal;
I$_A$ = 60 × 10⁻⁶ amp.

As a first approximation, it is assumed that V$_{TO}$ = 0.16 volt for all MOS transistors in the circuit. Then, the values of the transconductances β₁ and β₂ of M₁ and M₂, respectively, can be found from Equation (13), rewritten as:

$$\beta_1 = I_A / [(f_1 - e_1)(V_{IN} - V_{REF})][g_1(V_{DD} - V_{REF}) - V_{TO}] \quad (20)$$

and $$\beta_2 = I_A/[(f_2-e_2)(V_{In}-V_{REF})][g_2(V_{DD}-V_{REF})-V_{TO}] \quad (21)$$

Accordingly, from Equations (18), (19), (20), and (21), it is calculated that:

$$\beta_1 = 4.0 \times 10^{-6} \text{ amp/volt}^2, \text{ and}$$

$$\beta_2 = 2.3 \times 10^{-6} \text{ amp/volt}^2 \quad (22)$$

As is well known, the transconductance $\beta$ is useful for determining the ratio W/L, channel width to channel length, of an MOS transistor:

$$\beta = \beta_S(W/L) \quad (23)$$

where $\beta_S$ is defined as the "specific transconductance" and depends upon the oxide thickness among other device parameters. For a typical value of $\beta_S = 2.8 \times 10^{-5}$ amp/volt$^2$, corresponding to about 800 angstrom thick oxide, it is easily found (from Equations (22) and (23)) in this example that $$W_1/L_1 = 10/69 \quad (24)$$

and $$W_2/L_2 = 10/120 \quad (25)$$

Thus, for a channel width of 10 micron, the channel lengths of $M_1$ and $M_2$ are 69 micron and 120 micron, respectively.

As for the designs of the transconductances $\beta_3$, $\beta_4$, and $\beta_5$ of $M_3$, $M_4$, and $M_5$, respectively, in this example according to Equation (4) (neglecting $V_{TO}$):

$$\beta_3 = \frac{2I_D}{(V_{G3}-V_{S3})^2} = \frac{2I_D}{(V_{G2}-V_{IN})^2} = \frac{2I_D}{g_2^2(V_{DD}-V_{IN})^2} \quad (26)$$

$$\beta_4 = \frac{2I_D}{(V_{G4}-V_{S4})^2} = \frac{2I_D}{(V_{G1}-V_{G2})^2} = \frac{2I_D}{(g_1-g_2)^2(V_{DD}-V_{IN})^2} \quad (27)$$

$$\beta_5 = \frac{2I_D}{(V_{G5}-V_{S5})^2} = \frac{2I_D}{(V_{DD}-V_{G1})^2} = \frac{2I_D}{(1-g_1)^2(V_{DD}-V_{IN})^2} \quad (28)$$

where $I_D$ is the "divider" current through the source-drain paths of $M_3$, $M_4$, and $M_5$. In general, $I_D$ is chosen so as to minimize the nonlinear loading of the signal source, to minimize power dissipation, and to enable the desired frequency of operation.

Using a "divider" current $I_D = 5$ microamps as a convenient value, it follows from Equations (26)-(28) that:

$$\beta_3 = 0.98 \times 10^{-6} \text{ amp/volt}^2;$$

$$\beta_4 = 0.63 \times 10^{-6} \text{ amp/volt}^2; \text{ and}$$

$$\beta_5 = 15.6 \times 10^{-6} \text{ amp/volt}^2. \quad (29)$$

Again, with the specific transconductance $\beta_S = 2.8 \times 10^{-5}$ amp/volt$^2$, it is found that:

$$W_3/L_3 = 10/285;$$

$$W_4/L_4 = 10/444; \text{ and}$$

$$W_5/L_5 = 10/18. \quad (30)$$

However, it should be noted that Equations (26)-(28) were derived from Equation (4), neglecting $V_{TO}$, the threshold voltage. Taking the $V_{TO}$ term into consideration in Equation (4), it is found that:

$$\beta_3 = 2I_D/[g_2(V_{DD}-V_{IN})-V_{TO}]^2;$$

$$\beta_4 = 2I_D/[(g_1-g_2)(V_{DD}-V_{IN})-V_{TO}]^2; \text{ and}$$

$$\beta_5 = 2I_D/[(1-g_1)(V_{DD}-V_{IN})-V_{TO}]^2. \quad (31)$$

and correspondingly that:

$$W_3/L_3 = 10/259;$$

$$W_4/L_4 = 10/412; \text{ and}$$

$$W_5/L_5 = 10/12. \quad (32)$$

In order to calculate the parameters for the amplifier circuit shown in FIG. (8), it should be noted that the negative input terminal 71 of the operational amplifier 70 provides a virtual DC bias point of potential $V_{REF}$, which thus holds one terminal of each of the transistors $M_{IN}$ and $M_{FB}$ at this fixed potential $V_{REF}$. On the other hand, the output voltage $V_{OUT}$ of the operational amplifier at terminal 73 serves as the $V_{IN}$ of Equations (6) and (7) for the feedback transistor $M_{FB}$. Accordingly, for each of $M_{IN}$ and $M_{FB}$, it follows that e=0; f=1; and g=0.5. During operation, due to the biasing arrangement of both $M_{IN}$ and $M_{FB}$, input and output voltages can swing both on the positive and on the negative side of $V_{REF}$ without causing nonlinear distortions.

Substrate Effects

In the above example, as an approximation it was assumed that the threshold voltages $V_{TO}$ were all constant during operation. However, during operation with the circuit shown in FIG. 4, the "backgate" bias (source to substrate potential) of the transistor $M_2$, in particular, varies by reason of a varying input signal voltage $V_{IN}$. Accordingly, the threshold voltage $V_{TO}$ of $M_2$ will depend upon the input signal voltage and will thus add a further nonlinear term in Equation (9). This threshold voltage in the presence of nonzero source-to-substrate bias $V_S$ can, as known in the art, be approximated by:

$$V_{TO} = K_1(2\Phi_F + V_S)^{\frac{1}{2}} + Q_{SS}/C_{ox} \quad (33)$$

with:

$$K_1 = (2qEN)^{\frac{1}{2}}/C_{ox} \quad (34)$$

where $\Phi_F$ is the Fermi potential of the semiconductor substrate, $Q_{SS}$ is the interface charge density, q is the electron charge, E is the permittivity of the semiconductor substrate, N is the impurity concentration of the gate region of the semiconductor substrate, and $C_{ox}$ is the capacitance per unit area of the gate oxide. Replacing the source-to-substrate bias $V_S$ in Equation (33) by its expression in Equation (7):

$$V_{TO} = K_1(2\Phi_F + fV_{REF} + (1-f)V_{IN})^{\frac{1}{2}} + Q_{SS}/C_{ox} \quad (35)$$

To first order in $V_{IN}$, it thus is found (approximately) that:

$$V_{TO} = K_1(2\Phi_F + fV_{REF})^{\frac{1}{2}} + \frac{K_1(1-f)V_{IN}}{2(2\Phi_F + fV_{REF})^{\frac{1}{2}}} + Q_{SS}/C_{ox} \quad (36)$$

Introducing this expression for $V_{TO}$ into Equation (10) and setting to zero the coefficient of $V_{IN}$ within the square bracket, it is found that the linearity condition of Equation (11) becomes:

$$g = \frac{f+e}{2} - \frac{K_1(1-f)}{2(2\Phi_F + fV_{REF})^{\frac{1}{2}}} \quad (37)$$

Thus, while the value of $g_1$ in the illustrative example (FIG. 4) as given by Equation (15) remains unaffected (in the first order approximation) because $f_1 = 1$, the value of $g_2$ is somewhat lowered to compensate for threshold variations caused by varying source-to-substrate bias. For the above illustrative examples (leading to Equations (18) and (19)), assuming a substrate impurity concentration $N = 5 \times 10^{-14}$ per cm$^3$ and an oxide thickness of 800 Angstroms, $K_1$ is found to be about 0.31 volt and $g_2$ is found to be 0.387 (rather than 0.4 as previously in Equation (19) above). Correspondingly, the values of the transconductances $\beta$ and W/L ratios of $M_3$, $M_4$, and $M_5$ are slightly changed, so that instead of Equation (30) it is found in this same illustrative example that substrate effects change the values of $W_3/L_3$ and $W_4/L_4$:

$W_3/L_3 = 10/240;$ $W_4/L_4 = 10/421;$ and $W_5L_5 = 10/16. \quad (38)$

In the circuit of FIG. 6, using the same parameters, the ratios of W/L are found to be $W_1/L_1 = 10/69;$ $W_2/L_2 = 10/120;$ $W_3/L_3 = 10/180$ (or 10/215); and $W_4/L_4 = 10/400. \quad (39)$ where the value of $W_3/L_3$ was optimized by trial and error computer simulation (the value in parentheses corresponding to no threshold variation due to substrate effect).

In the foregoing example, the value of $I_D$, the divider current, was conveniently selected to be 5 microamps and the transistor parameters $\beta_3$, $\beta_4$, $\beta_5$ were calculated on this selection. It should be understood, of course, that other values of this current can be used in conjunction with different parameters, subject to the considerations that too low a value of $I_D$ leads to poor high frequency performance (above the order of 10 megaherz for a current of a microamp) and unreasonably low $\beta$ (large L) for the transistor channels, and that too high a value of $I_D$ leads to undesirably large power dissipation and unreasonably high $\beta$ (large W) for the transistor channels.

In another example for purposes of illustration only, the following parameters have been found to be useful in a specific N-MOS embodiment in accordance with FIG. 6:

$I_D = 18$ μa $I_A = 1$ na (at no signal)

$W_1/L_1 = 8/44$ $W_2/L_2 = 8/350$ $W_3/L_3 = 8/160$ $W_4/L_4 = 8/75$ $V_{IN} = 3.55$ volts ± signal $V_{DD} = 12$ volt $V_{BB} = -5$ volt (substrate negatively biased)

$V_{REF} = 3.55$ volt.

Although this invention has been described in terms of specific embodiments, various modifications can be made without departing from the scope of the invention. For example, P-MOS transistors can be used instead of N-MOS, with appropriate modifications in operating voltages.

We claim:

1. An MOS transistor load element CHARACTERIZED IN THAT a gate electrode of said element is connected to a node to which the source of a first auxiliary MOS transistor (M$_4$) and the drain of a second auxiliary MOS transistor (M$_3$) are connected, the high current path through said first and second MOS transistors being electrically coupled mutually in series with the high current path of said transistor load element, the drain of the transistor load element (M$_2$) being connected to an input terminal (V$_{IN}$), the transconductance of said auxiliary transistors being such as to render substantially linear the electrical resistance of the load element.

2. Semiconductor apparatus comprising:
   (a) a first MOS field effect transistor (M$_2$) whose drain is connected to an input terminal (V$_{IN}$), and whose source is connected to an output terminal (V$_{OUT}$);
   (b) second and third MOS field effect transistors (M$_3$ and M$_4$), the drain of the second transistor and the source of the third transistor connected to a common node, and the drain of the first transistor connected to the source of the second transistor;
   (c) means for connecting the gate of the first transistor to said node; and
   (d) means for connecting the gate electrode of the third transistor to its drain; the transconductance of the second and third transistor being such that the source-to-drain current of the first transistor is a substantially linear function of its source-to-drain voltage.

3. Apparatus according to claim 2 in which said first, second, and third transistors are all formed in different portions of a single semiconductive silicon crystal body, and in which the oxide layer thicknesses of all said transistors are the same.

4. Apparatus according to claim 3 in which the gate electrode of the second transistor is connected to its drain.

5. Apparatus according to claim 3 in which the gate electrode of the second transistor is connected to gate electrode of the third transistor.

6. Semiconductor apparatus comprising:
   (a) an amplifier (70) having an input amplifier terminal (71) and an output amplifier terminal (73);
   (b) a first MOS field effect transistor (M$_{FB}$) having one high current carrying terminal connected to said input amplifier terminal (71), and having another high current carrying terminal connected to said output amplifier terminal (73), and having a gate electrode connected to a first node (N$_{34}$);

(c) a second MOS field effect transistor (M$_{IN}$) having one high current carrying terminal connected to said input amplifier terminal (71), having another high current carrying terminal connected to an input signal terminal (74), and having a gate electrode connected to a second node (N'$_{34}$);

(d) third and fourth MOS field effect transistors (M$_3$ and M$_4$), each having one high current carrying terminal connected to said first node (N$_{34}$), another high current carrying terminal of the third transistor (M$_3$) being connected to said output terminal (73) and another high current carrying terminal of said fourth terminal (M$_4$) being connected to its gate electrode and to a drain voltage terminal (DD);

(e) fifth and sixth MOS field effect transistors (M'$_3$ and M'$_4$), each having one high current carrying terminal connected to a second node (N'$_{34}$), another high current carrying terminal of the fifth transistor (M'$_3$) being connected to said input signal terminal (74), and another high current carrying terminal of said sixth transistor (M'$_4$) being connected to its gate electrode and to said drain voltage terminal (DD).

7. Apparatus according to claim 6 in which the gate electrode of said third transistor (M$_3$) is connected to said first node (N$_{34}$) and in which the gate electrode of said fifth transistor (M'$_3$) is connected to said second node (N'$_{34}$).

8. Apparatus according to claim 7 in which said first, second, third, fourth, and fifth transistors are integrated in a single crystal semiconductive body together with said amplifier.

9. Apparatus according to claim 8 in which said input amplifier terminal (71) is a negative summing input terminal of said amplifier.